US009821397B2

(12) United States Patent
Kuramoto et al.

(10) Patent No.: US 9,821,397 B2
(45) Date of Patent: *Nov. 21, 2017

(54) SOLDER PRECOATING METHOD AND WORKPIECE FOR ELECTRONIC EQUIPMENT

(75) Inventors: Takeo Kuramoto, Atsugi (JP); Kaichi Tsuruta, Tochigi (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 790 days.

This patent is subject to a terminal disclaimer.

(21) Appl. No.: 11/793,054

(22) PCT Filed: Dec. 20, 2004

(86) PCT No.: PCT/JP2004/018995
§ 371 (c)(1),
(2), (4) Date: Feb. 29, 2008

(87) PCT Pub. No.: WO2006/067827
PCT Pub. Date: Jun. 29, 2006

(65) Prior Publication Data
US 2008/0213613 A1    Sep. 4, 2008

(51) Int. Cl.
*B32B 3/00*     (2006.01)
*B23K 3/06*     (2006.01)
(Continued)

(52) U.S. Cl.
CPC ......... *B23K 3/0623* (2013.01); *H05K 3/3484* (2013.01); *B23K 2201/40* (2013.01);
(Continued)

(58) Field of Classification Search
USPC .......................................................... 428/901
See application file for complete search history.

(56) References Cited

U.S. PATENT DOCUMENTS 2,963,748 A * 12/1960 Young .......................... 264/104
3,031,344 A *  4/1962 Sher et al. .................... 428/551
(Continued)

FOREIGN PATENT DOCUMENTS

DE     197 14 755     10/1998
DE     198 59 735      7/2000
(Continued)

*Primary Examiner* — Seth Dumbris
(74) *Attorney, Agent, or Firm* — Michael Tobias

(57) ABSTRACT

Problem

Precoating methods for previously adhering solder to areas to be soldered of a workpiece for an electronic part such as a printed circuit board, a chip part, or a wafer include the plating method, the hot leveling method, the solder paste method, the solder ball method, and the like. In these conventional precoating methods, solder did not uniformly adhere to areas to be soldered, solder did not completely adhere, and much equipment and time were required. The present invention provides a method which can perform precoating with uniform application and without the occurrence of defects using simple equipment and a workpiece to which solder is uniformly adhered.

Means for Solving the Problem

In the present invention, an excess amount of solder powder is dispersed atop an adhesive applied to a substrate, and then excess solder powder which is not adhered to the adhesive is removed. The surface on with solder powder is dispersed is then stacked on a workpiece to which flux is applied with the application of pressure, heating is then performed, and solder is adhered only to areas to be soldered.

17 Claims, 3 Drawing Sheets

(51) Int. Cl.
 *H05K 3/34* (2006.01)
 *B23K 101/40* (2006.01)
(52) U.S. Cl.
 CPC ............ *H05K 2203/0338* (2013.01); *H05K 2203/0425* (2013.01); *Y10T 428/12229* (2015.01)

(56) References Cited

U.S. PATENT DOCUMENTS

| | | | | |
|---|---|---|---|---|
| 4,327,124 | A | * | 4/1982 | DesMarais, Jr. ............ 427/97.5 |
| 5,114,744 | A | * | 5/1992 | Cloutier et al. ............ 427/542 |
| 5,846,366 | A | * | 12/1998 | Jin et al. ............ 156/233 |
| 5,928,440 | A | * | 7/1999 | Kuramoto et al. ............ 148/24 |
| 6,138,348 | A | * | 10/2000 | Kulesza et al. ............ 29/840 |
| 6,486,413 | B1 | * | 11/2002 | Ogure ............ 174/261 |
| 7,294,358 | B2 | * | 11/2007 | Tam ............ 427/58 |
| 8,701,973 | B2 | * | 4/2014 | Kuramoto ............ B23K 1/0016 228/245 |

FOREIGN PATENT DOCUMENTS

| | | | |
|---|---|---|---|
| GB | 478717 | * | 9/1952 |
| GB | 678717 | * | 9/1952 |
| JP | 07336033 | | 12/1995 |
| JP | 07336034 | | 12/1995 |
| JP | 08307047 | | 11/1996 |
| JP | 08340174 | | 12/1996 |
| JP | 09167883 | | 6/1997 |
| JP | 11054890 | | 2/1999 |

* cited by examiner (A)

(B)

(C)

(D)

SOLDER PRECOATING METHOD AND WORKPIECE FOR ELECTRONIC EQUIPMENT

TECHNICAL FIELD

This invention relates to a solder precoating method for previously adhering solder to areas to be soldered of a workpiece for electronic equipment and a workpiece for electronic equipment which is precoated with solder in areas to be soldered.

BACKGROUND ART

In general, methods of soldering workpieces for electronic equipment such as printed circuit boards, chip parts, wafer elements, and integrated circuit parts such as BGA's and CSP's (referred to below simply as workpieces) include the flow soldering method in which areas to be soldered are contacted with a wave of molten solder, and the reflow soldering method in which solder paste is applied to areas to be soldered of a workpiece and then the workpiece is heated in a heating apparatus such as a reflow furnace.

In the flow soldering method, a liquid flux is applied to a printed circuit board on which electronic parts are mounted, and after the flux is dried, the substrate is contacted with a wave of molten solder to carry out soldering. However, with the flow soldering method, when portions being soldered are extremely small, not only is it difficult to adhere molten solder thereto, but even if solder adheres, the adhered amount is not consistent, and there are problems with respect to subsequent reliability. Moreover, in the flow soldering method, large equipment is necessary, such as a fluxer which applies flux to a workpiece, a preheater which dries the flux and performs preheating, and a soldering tank which melts solder and produces a wave of molten solder.

In the reflow soldering method, a mask having holes bored in locations coinciding with the areas to be soldered of a printed circuit board is placed atop the printed circuit board, solder paste is then placed atop the mask, and the paste is wiped with a squeegee to fill the holes in the mask with solder paste. The mask is then removed, and the solder paste is applied to areas to be soldered. The printed circuit board is heated in a heating apparatus such as a reflow furnace, and soldering is carried out by melting the solder paste. In the reflow soldering method, solder can be adhered to relatively small areas to be soldered, but this method also has the problem that the adhered amount is not consistent. In addition, in the reflow soldering method, it is necessary to prepare a mask matching the workpiece, and when the workpiece is very small, it is very troublesome to align the holes in the mask with the areas to be soldered of the workpiece. Moreover, in the reflow soldering method, an apparatus for application of the solder paste by printing is always necessary. Not only is this apparatus expensive, but it is necessary to provide a place for its installation.

In light of these problems of the flow soldering method and the reflow soldering method, in recent years, "solder precoats" comprising solder which is previously adhered to areas to be soldered of a workpiece have come to be used. Methods for obtaining a solder precoat include, for example, the plating method (Patent Document 1), the hot leveling method (Patent Document 2), the solder paste method (Patent Document 3), and the solder ball method (Patent Document 4).

Patent Document 1: JP H9-167883 A1
Patent Document 2: JP H11-54890 A1
Patent Document 3: JP H8-307047 A1
Patent Document 4: JP H8-340174 A1

DISCLOSURE OF INVENTION

Problem which the Invention is to Solve

In the plating method for obtaining a precoat, a workpiece is immersed in a plating liquid, and solder is precipitated on areas to be soldered of the workpiece. The plating method has the restriction that not every type of solder composition can be used. Namely, in the plating method, the type of plating liquid is restricted, so it is not possible to precoat solder of a desired composition. In addition, large equipment is necessary for treatment of the plating liquid, resulting in the problem that initial costs are high. Furthermore, in the plating method, it is difficult to adhere the necessary amount of solder, i.e., an amount of solder such that soldering can take place, to areas of a workpiece to be soldered.

In the hot air leveling method, a workpiece is immersed in molten solder, and after it is pulled out of the molten solder, hot air is blown at the workpiece and excess solder is blown off. The hot air method can adjust the adhered amount of solder by adjusting the amount of hot air which is blown, but it has the problem that there are large variations in the amount of adhered solder.

In the solder paste method, as in the above-described reflow soldering method, a mask having holes bored in locations matching areas to be soldered is used. After areas to be soldered of a workpiece and the holes in the mask are aligned, a solder paste is placed atop the mask and wiped with a squeegee. The mask is then removed and the workpiece is heated, whereby the solder paste is melted and solder is adhered to areas to be soldered of the workpiece. However, in the solder paste method, if the areas to be soldered of the workpiece are very small, it is extremely difficult to align the areas to be soldered and the holes in the mask, and there are often cases in which solder paste is not applied to areas to be soldered. In addition, the solder paste method has the problems that solder paste does not fill very small holes in the mask, and that after filling the holes, the solder paste is not applied to areas to be soldered.

The solder ball method is a method in which after solder balls are sucked by a suction jig and mounted on areas to be soldered of a workpiece, the workpiece is heated in a heating apparatus such as a reflow furnace and the solder balls are melted to obtain a solder precoat. If solder balls having a uniform size can be used in the solder ball method, the amount of adhered solder can be made uniform. However, the solder ball method had limits on the shape in that only a circular precoat like a solder bump could be obtained. In addition, in the solder ball method, it is necessary to previously prepare solder balls having a prescribed size, but a large amount of work and equipment are necessary to manufacture these solder balls, so manufacture becomes expensive. In the solder ball method, after solder balls are sucked by a suction jig, air is blown from suction holes to release the solder balls and thereby mount the solder balls on the areas to be soldered of the workpiece. However, when the solder balls are sucked by the suction jig, there are the problems that a plurality of solder balls may adhere to one hole due to static electricity, or that when solder balls are released onto a workpiece, as a result of the energy of the air blown from the suction holes, the solder balls may fly out and not be mounted on the areas to be soldered of a workpiece.

The present invention was made in light of the problems of conventional precoating methods, and it provides a method of solder precoating which can uniformly adhere solder not only to very small areas to be soldered but also to large areas to be soldered, which does not require expensive equipment, and which can adhere solder of any composition. It also provides a workpiece to which solder is uniformly adhered.

Means for Solving the Problem

The present inventors found that if a powder is dispersed on an adhesive area, only a single layer comprising the lowermost portion of the powder adheres to the adhesive, that if solder powder contacts areas to be soldered, molten solder moves from the adhesive to the areas to be soldered and adheres thereto, and that if areas to be soldered are not present in the vicinity of the molten solder, the molten solder becomes difficult to move, and they completed the present invention.

The present invention is a solder precoating method characterized by comprising:

A. A step of applying an adhesive to atop a substrate;

B. A step of dispersing a solder powder atop the adhesive on the entire surface of the substrate and adhering one layer of solder powder to the adhesive;

C. A step of removing solder powder which did not adhere to the adhesive on the substrate;

D. A step of applying a flux to a surface to be soldered of a workpiece;

E. A step of stacking the portion of the substrate having solder powder and the flux-coated surface of the workpiece and applying pressure;

F. A step of heating the stacked substrate and workpiece to at least the melting temperature of the solder powder and adhering molten solder to the areas to be soldered of the workpiece;

G. A step of cooling the workpiece and solidifying the molten solder after the molten solder has adhered to the areas to be soldered of the workpiece and then removing the substrate; and H. A step of removing solder which adhered to locations other than areas to be soldered of the workpiece.

According to another aspect, the present invention is a workpiece for electronic equipment characterized in that solder powder adhered to an adhesive on a substrate and areas to be soldered of a workpiece are placed into a stacked relationship, the solder powder is melted, and only solder in locations coinciding with the areas to be soldered is adhered to the areas to be soldered of the workpiece.

Effects of the Invention

The present invention has excellent reliability in that a fixed amount of solder is always adhered to areas to be soldered of a workpiece, there are no defects such as unsoldered portions even when a workpiece is tiny, and solder of any composition can be adhered to areas to be soldered. In addition, the present invention has the simplicity that it is not necessary to prepare a mask used in the printing method or a jig corresponding to areas to be soldered of a workpiece like a suction jig used in the solder ball method. Furthermore, a workpiece for electronic equipment according to the present invention has a fixed amount of solder uniformly adhered to areas to be soldered. Therefore, when the workpiece is soldered to another workpiece, strong bonding can be achieved.

BEST MODE FOR CARRYING OUT THE INVENTION

A material which has heat resistance such that it maintains its shape even when heated to at least the melting point of solder powder and to which molten solder does not readily adhere is suitable as a substrate for use in the present invention. Suitable substrates for use in the present invention are metals such as aluminum and stainless steel, and plastics and composites such as polyamide resins and glass-epoxy composites.

The adhesive applied to the substrate performs the function of adhering one layer of solder powder to the substrate and securing the layer to the substrate as well as conforming to irregularities in the surface of the substrate and adhering the solder powder to areas to be soldered at the time of adhesion by heating. An adhesive used in the present invention can be selected from adhesives having adhesion at room temperature and hot melt adhesives which exhibit adhesion when heated. The thickness of the adhesive layer is preferably a film thickness of at least 1 micrometer and less than 50 micrometers, but there is no particular restriction on the thickness.

In the present invention, after solder powder is applied over the entire surface of the substrate atop the adhesive applied to the substrate, solder powder which is not adhered to the adhesive is removed. Removal methods which can be used include lightly brushing the solder powder with a brush having a flexible tip to level the solder powder, blowing off the powder with weak compressed air, or turning the substrate upside down and lightly vibrating it. At this time, it is necessary to be careful not to remove the one layer of solder powder adhered to the adhesive.

A solder powder used in the present invention is selected based on the desired solder film thickness. Namely, when a thin solder film is desired, a fine solder powder is selected, and in the case of a thick solder film, a large solder powder is selected. From the standpoint of economy, it is preferable to use solder powder which can be inexpensively obtained such as that obtained by the atomizing method and to classify it with a sieve.

The flux used in the present invention is present in the necessary amount on areas to be soldered of a workpiece. Preferably as little as possible is present on areas which are not to be soldered such as resist surfaces. In general, the surface level of the areas to be soldered of a workpiece is lower than the top surface of the resist. Thus, if after flux is applied to the entire surface of the workpiece, flux on the resist surface can be scraped off onto the areas to be soldered by a rubber blade or the like, and flux can always be applied to the areas to be soldered. As a result, molten solder is smoothly bonded to areas to be soldered, molten solder does not remain on the resist, and bridging does not occur between extremely fine areas to be soldered.

In the present invention, after flux is applied to the surface to be soldered of a workpiece, the workpiece and a substrate having solder powder adhered thereto are placed into a stacked relationship and adhered under pressure. The pressure which is applied at this time varies depending upon the shape of the surface of the workpiece, the area of the workpiece, and the required adhesion, but it is preferably at least 1 newton per square centimeter. The heating temperature when heating the stacked workpiece and substrate is preferably at least the melting point of the solder powder.

If cooling is immediately performed after the solder powder melts and the substrate is removed, solder is formed on the areas to be soldered of the workpiece. However, excess solder is present on resist surfaces, which are not areas to be soldered. In this state, bridging occurs between areas to be soldered and the insulating resistance decreases. Therefore, the excess solder is removed. Excess solder can be removed by any method, but removal by washing is preferred. If washing is performed, flux residue present on the areas to be soldered can also be removed at the same time to further increase reliability. If the shape of the solder adhered to the areas to be soldered is to be adjusted, a step can be added in which flux is again applied to the areas to be soldered and then heating is performed to at least the melting temperature of the solder, followed by cooling.

In the present invention, the accuracy of the solder film thickness which is adhered to areas to be soldered is high. This is because the variation in the amount of solder powder per unit area which is adhered to the adhesive surface of the substrate is small. Accordingly, when the substrate and the workpiece are placed into a stacked relationship and pressure is applied, the solder powder contacts the areas to be soldered, and when the solder powder melts, molten solder always contacts the areas to be soldered. Therefore, a fixed amount of solder powder adheres to the areas to be soldered, and the accuracy of the film thickness is improved. Solder powder which contacts the resist surface outside of the areas to be soldered also melts, but wetting and lateral spreading is suppressed by the adhesive layer, which is not wet by solder. As a result, bridging does not readily occur even with an extremely fine pattern of areas to be soldered.

EXAMPLES

A precoating method according to the present invention will next be explained based on the figures. FIGS. 1(A)-8(H) are explanatory views of steps for carrying out precoating according to the present invention.

A. Step of Applying an Adhesive to a Substrate

An adhesive 2 is applied to one side of a substrate 1.

B. Step of Dispersing Solder Powder on the Adhesive

A solder powder 3 is dispersed on the adhesive 2 applied to the substrate 1 so as to conceal the adhesive 2.

C. Step of Removing Excess Solder Powder

The solder powder on the substrate 1 is uniformly dispersed with a brush 4, and excess solder powder 3 not adhering to the adhesive 2 is removed.

D. Step of Applying Flux to the Workpiece

A liquid flux 8 is applied with a spray fluxer 7 to the surface of a workpiece 5 on which areas to be soldered 6 are formed. Then, if necessary, flux applied to the portions which are not to be soldered, such as to a resist 9, may be removed.

E. Step of Stacking the Substrate and the Workpiece

The flux-coated surface of the workpiece 5 and the surface of the substrate 1 to which solder powder is adhered are placed into a stacked relationship. At this time, pressure is applied to the workpiece 5 and the substrate 1 by an unillustrated press from above the substrate 1. Since the adhesive has the ability to conform, when pressure is applied to the substrate 1, solder powder 3 adhered to the adhesive 2 contacts the areas to be soldered 6 which are slightly recessed with respect to the resist 9 on the workpiece 5.

F. Step of Heating the Substrate and the Workpiece

The stacked workpiece 5 and substrate 1 are heated by an unillustrated heating apparatus, and the solder powder 3 adhered to the adhesive 2 on the substrate 1 is melted. At this time, solder powder which contacts the areas to be soldered 6 of the workpiece 5 melts, and it wets and spreads over the areas to be soldered 6. Even though the solder powder on the resist 9 melts, it remains in place.

G. Step of Removing the Substrate after Solidifying the Solder

After molten solder is adhered to the areas to be soldered 6 of the workpiece 2, the workpiece 2 and the substrate 1 are cooled to solidify the molten solder and form a precoat 10 on the areas to be soldered 6. The substrate 1 is then removed (as shown by the arrow).

H. Step of Removing Solder from Unnecessary Locations

If solder is left adhering to unnecessary locations such as the resist 9, as described above, it causes bridging or a decrease in insulation resistance. Therefore, solder is removed from unnecessary locations. Since solder is secured to unnecessary locations by flux residue, cleaning may be performed by immersion in a cleaning liquid 11 which can dissolve flux residue. When an aqueous flux is used, warm water is suitable, and when a resin flux is used, an organic solvent such as alcohol is suitable. In order to adjust the shape of solder which is adhered to the areas to be soldered, after flux is applied to the solder surface, reheating and cooling may be carried out.

Solder was adhered to a workpiece by the above-described precoating method in the following manner.

An acrylic adhesive layer with a thickness of 10 µm was formed on one side of a substrate made of aluminum and having a thickness of 200 µm. Sn-3 Ag-0.5 Cu solder powder obtained by the atomizing method was classified with a lower limit of 5 µm and an upper limit of 15 µm and was adhered to the adhesive surface of the substrate. At this time, the solder powder was dispersed so as to hide the adhesive. Next, the solder powder dispersed on the substrate was uniformly spread out with a brush, and then it was blown with weak compressed air to remove excess solder powder. When the surface on which solder powder was dispersed was observed with a microscope after removal of excess solder powder, only a single layer of solder powder was adhered to the adhesive. A workpiece on which a solder precoat was to be formed was a glass-epoxy substrate with outer dimensions of 30×30 mm. 3600 electrodes with a pitch of 200 µm which were areas to be soldered were formed on the glass-epoxy substrate. The thickness of the resist in the vicinity of the electrodes was 25 µm. An aqueous liquid flux was applied to the surface of the workpiece on which the electrodes were formed, flux applied atop the resist was wiped off with a rubber blade, and the electrodes were adequately filled with flux. Only an extremely thin layer of flux remained in the portions of the resist which were wiped with the rubber blade. After the portions of the substrate to which solder powder was adhered and the flux-coated surface of the workpiece were placed into a stacked relationship, a pressure of 100 N was applied to the substrate with a press, heating was then performed at 220° C. for 10 seconds, and then cooling was performed. The substrate was removed from the cooled workpiece, the workpiece was washed with warm water at 40° C., and solder adhering atop the resist was removed. In order to adjust the shape of the solder adhered to the areas to be soldered, a flux was applied to the areas to be soldered, heating was again performed to at least the melting temperature of the solder, cooling was carried out, and then washing was performed with warm water. As a result, solder precoats measuring 30 µm±3 µm were formed only on the electrodes of the workpiece.

Figure 1:
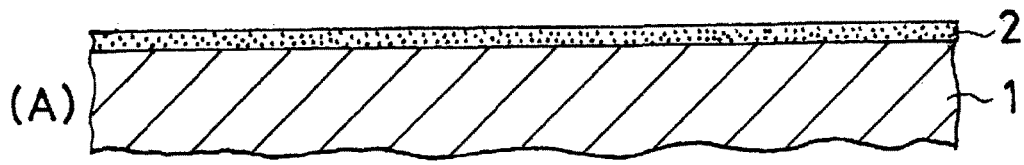
FIG. 1—Step of applying an adhesive to atop a substrate
FIG. 2—Step of dispersing solder powder atop the adhesive
FIG. 3—Step of removing excess solder powder
FIG. 4—Step of applying flux to a workpiece
FIG. 5—Step of stacking the substrate and the workpiece
FIG. 6—Step of heating the substrate and the workpiece
FIG. 7—Step of removing the substrate after solidifying the solder
FIG. 8—Step of removing solder from unnecessary locations
Figure 2:
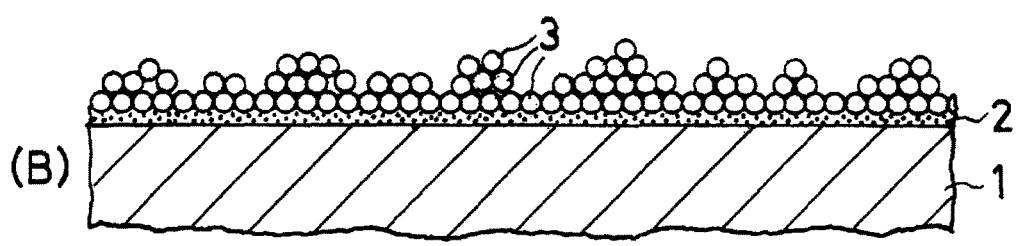
Figure 3:
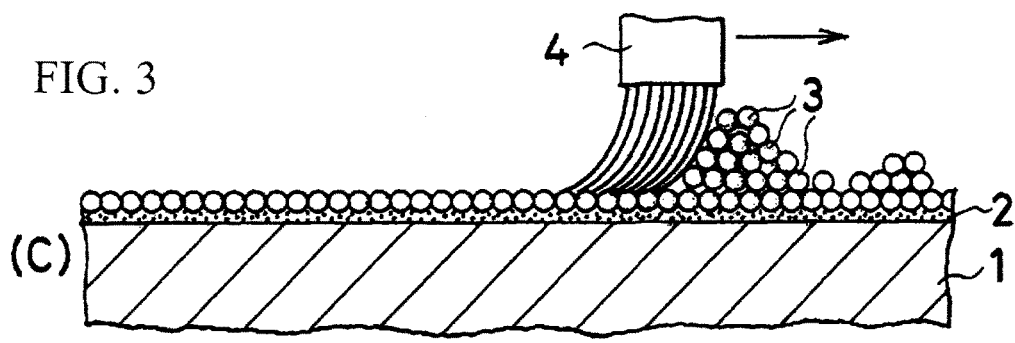
Figure 4:
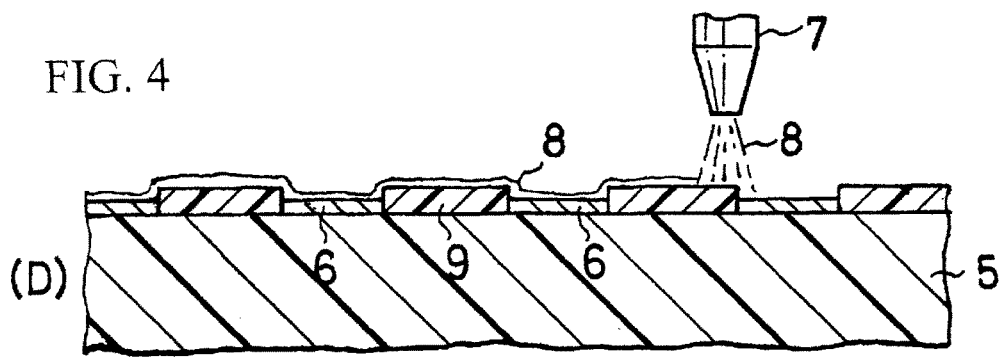
Figure 5:
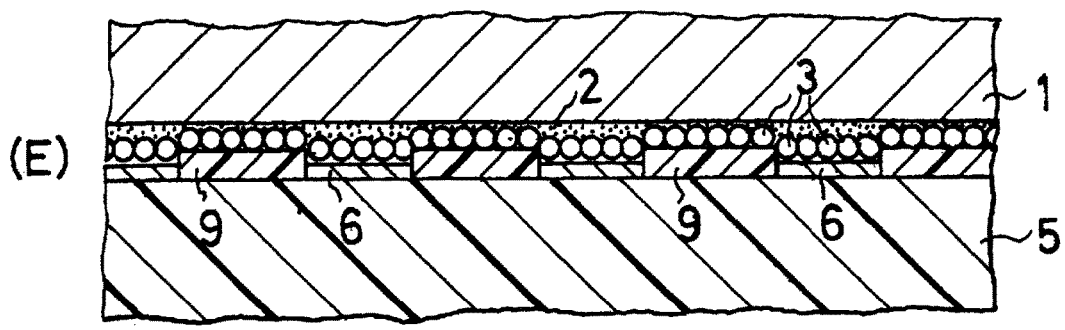
Figure 6:
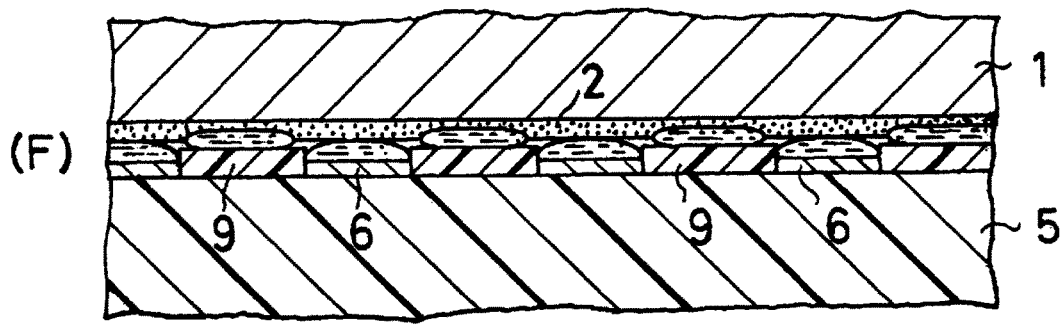
Figure 7:
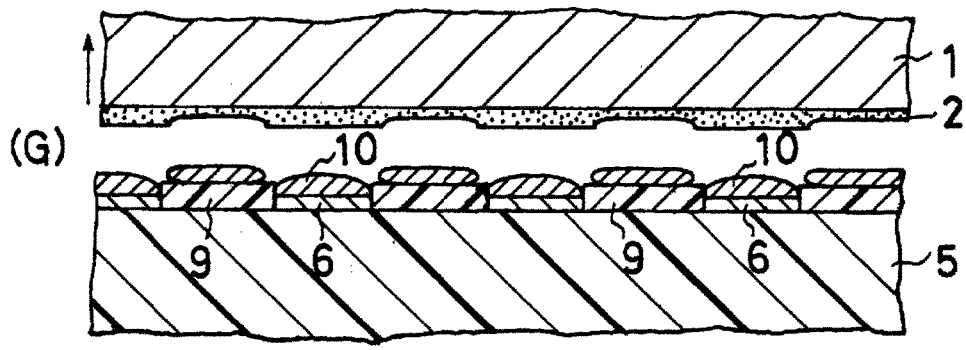
Figure 8:
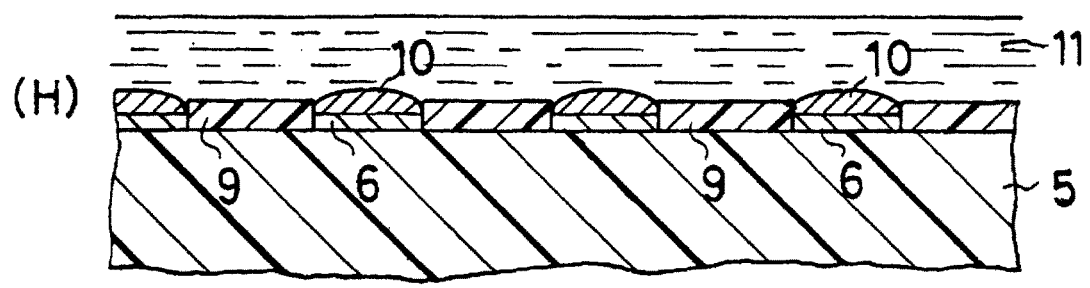

EXPLANATION OF SYMBOLS 1 substrate
2 adhesive
3 solder powder
5 workpiece
6 areas to be soldered
8 flux
9 resist

INDUSTRIAL APPLICABILITY

The present invention can form fine solder precoats having a highly accurate film thickness on wiring or electrodes not only of relatively large electronic parts such as printed circuit boards but also on wafers, CSP's, and the like having very small areas to be soldered, such as electrodes with a diameter of at most 0.2 mm.

The invention claimed is:

1. A solder precoating method comprising:
applying an adhesive atop a substrate;
dispersing a solder powder atop the adhesive in an amount greater than an amount necessary to completely cover the adhesive and adhering a single layer of solder powder to the adhesive;
removing from the substrate excess solder powder not in the single layer;
coating a surface to be soldered of a workpiece with flux;
stacking the surface of the substrate to which solder powder is adhered and the flux-coated surface of the workpiece and applying pressure;
heating the stacked substrate and workpiece to adhere the solder powder to areas to be soldered of the workpiece;
removing the substrate from the workpiece while leaving solder adhered to the areas to be soldered of the workpiece; and
removing adhered solder from locations on the workpiece other than the areas to be soldered of the workpiece.

2. A solder precoating method as claimed in claim 1 wherein the adhesive exhibits adhesion at or above room temperature.

3. A solder precoating method as claimed in claim 1 wherein the substrate is selected from materials having heat resistance at the melting point of the solder or higher.

4. A solder precoating method as claimed in claim 1 wherein the substrate is selected from metals, ceramics, and plastics.

5. A solder precoating method as claimed in claim 1 including heating the stacked substrate and workpiece to melt adjoining solder powder together and form layers of molten solder adhered to the areas to be soldered of the workpiece.

6. A solder precoating method as claimed in claim 1 wherein the workpiece includes a resist having a top surface higher than a top surface of the areas to be soldered, and the amount of solder adhered to each area to be soldered is such that a top surface of the adhered solder extends above the top surface of the resist.

7. A solder precoating method as claimed in claim 1 wherein the workpiece includes a resist between the areas to be soldered, and heating the stacked substrate and workpiece melts solder powder opposing the resist.

8. A solder precoating method as claimed in claim 7 including melting together adjoining solder powder opposing the resist to form layers of molten solder opposing the resist.

9. A solder precoating method as claimed in claim 1 wherein the areas to be soldered comprise electrodes of the workpiece.

10. A solder precoating method as claimed in claim 1 wherein the adhesive is an acrylic adhesive.

11. A solder precoating method comprising:
applying an adhesive atop a substrate;
dispersing a solder powder atop the adhesive in an amount greater than an amount necessary to completely cover the adhesive and adhering a single layer of solder powder to the adhesive;
removing from the substrate excess solder powder not in the single layer;
placing the substrate and a workpiece having electrodes formed on a surface thereof in a stacked relationship with the solder powder on the substrate opposing the surface of the workpiece on which the electrodes are formed;
heating the stacked substrate and workpiece to at least the melting temperature of the solder powder while applying pressure to melt adjoining solder powder together and form a layer of molten solder adhered to each electrode of the workpiece;
cooling the workpiece to solidify the molten solder and then removing the substrate from the workpiece; and
removing adhered solder from locations on the workpiece other than the electrodes.

12. A solder precoating method as claimed in claim 11 wherein the workpiece includes a resist which separates the electrodes from each other, the substrate and the workpiece are placed in the stacked relationship with the solder powder on the substrate opposing the resist on the workpiece, and the heating melts together adjoining solder powder opposing the resist to form layers of molten solder opposing the resist.

13. A solder precoating method as claimed in claim 12 wherein cooling the workpiece solidifies the molten solder on the electrodes and the molten solder on the resist, and removing the substrate from the workpiece leaves solidified solder on the electrodes and the resist.

14. A solder precoating method as claimed in claim 11 wherein the adhesive is an acrylic adhesive.

15. A solder precoating method as claimed in claim 11 including removing the excess solder powder with a brush.

16. A solder precoating method as claimed in claim 11 including removing the excess solder powder with compressed air.

17. A solder precoating method as claimed in claim 11 including dispersing the solder powder atop the adhesive in an amount sufficient to hide the adhesive beneath the solder powder.

* * * * *